US010312213B2

(12) United States Patent
Beck et al.

(10) Patent No.: US 10,312,213 B2
(45) Date of Patent: Jun. 4, 2019

(54) POWER SEMICONDUCTOR DEVICE COMPRISING A SUBSTRATE AND LOAD CURRENT TERMINAL ELEMENTS

(71) Applicant: SEMIKRON ELEKTRONIK GMBH & CO. KG, Nuremberg (DE)

(72) Inventors: Markus Beck, Neumarkt (DE); Alexander Schneider, Fürth (DE); Hartmut Kulas, Heroldsberg (DE); Patrick Graschl, Wolframs-Eschenbach (DE); Christian Zeller, Pommersfelden (DE)

(73) Assignee: SEMIKRON ELEKTRONIK GMBH & CO. KG, Nuremberg (DE)

( * ) Notice: Subject to any disclaimer, the term of this patent is extended or adjusted under 35 U.S.C. 154(b) by 0 days.

(21) Appl. No.: 15/669,159

(22) Filed: Aug. 4, 2017

(65) Prior Publication Data

US 2018/0061802 A1    Mar. 1, 2018

(30) Foreign Application Priority Data

Aug. 23, 2016 (DE) .......................... 10 2016 115 572

(51) Int. Cl.
*H01L 23/48* (2006.01)
*H01L 23/00* (2006.01)
*H01L 23/473* (2006.01)

(52) U.S. Cl.
CPC ............ *H01L 24/72* (2013.01); *H01L 23/473* (2013.01); *H01L 23/48* (2013.01)

(58) Field of Classification Search
CPC ....... H01L 23/48; H01L 25/18; H01L 29/739; H02M 1/00; H01G 4/40
See application file for complete search history.

(56) References Cited

U.S. PATENT DOCUMENTS

2013/0203218 A1* 8/2013 Bayerer .................. H01L 21/50
438/121

FOREIGN PATENT DOCUMENTS

DE   10 2006 006 423    8/2007
DE   10 2009 057 146    6/2011
(Continued)

OTHER PUBLICATIONS

DE 10 2016 115 572.1, Examination Report dated Mar. 15, 2017, 5 pages—German, 2 pages—English.
(Continued)

*Primary Examiner* — Allen L Parker
*Assistant Examiner* — Gustavo G Ramallo
(74) *Attorney, Agent, or Firm* — Lackenbach Siegel, LLP; Andrew F. Young

(57) ABSTRACT

The invention relates to a power semiconductor device with a substrate with a cooling device and power semiconductor components connected thereon, having load current terminal elements and a cooling device. Pressure devices have a pressure element is arranged movably in a direction normal (N) to the substrate, and an elastic deformation element between the pressure element and a load current terminal element. The pressure element presses the assigned load current terminal element against an electrically conductive contact area of the substrate via the elastic deformation element and provides electrically conductive pressure contacting of the assigned load current terminal element with the substrate. The electrical connection of the power semiconductor device is improved.

20 Claims, 4 Drawing Sheets

(56) References Cited

FOREIGN PATENT DOCUMENTS

DE    10 2013 209 431    11/2014
DE    10 2014 104 308    7/2015

OTHER PUBLICATIONS

Amended filed claims regarding Response to German Office Action of Mar. 15, 2017 for DE 10 2016 115 572.1, German—3 pages, English 7 pages (and COT).

* cited by examiner

POWER SEMICONDUCTOR DEVICE COMPRISING A SUBSTRATE AND LOAD CURRENT TERMINAL ELEMENTS

CROSS REFERENCE TO RELATED APPLICATIONS

This application relates to, and claims priority from, DE Ser. No. 10 2016 115 572.1, the entire contents of which are incorporated herein fully by reference.

FIGURE SELECTED FOR PUBLICATION

FIG. 1

BACKGROUND OF THE INVENTION

Field of the Invention

The invention relates to a power semiconductor device comprising a substrate and load current terminal elements.

Description of the Related Art

DE10 2014 104 308 B3 discloses a power semiconductor device system in which a plurality of power semiconductor devices are arranged in a manner stacked one on top of another. The respective power semiconductor device has electrically conductive load current terminal elements connected to the substrate. Such a power semiconductor device system is constructed very compactly and has a very small space requirement on account of this.

DE 10 2009 057 146 A1 discloses a power semiconductor device comprising power semiconductor components, comprising a pressure device, load current terminal elements, comprising a cooling device and comprising a substrate, wherein the pressure device presses the load current terminal elements against the substrate and thereby brings about electrically conductive pressure contacting of the load current terminal elements with the substrate.

ASPECTS AND SUMMARY OF THE INVENTION

According to one alternative aspect of the present invention, there is provided a power semiconductor device comprising a substrate, comprising power semiconductor components arranged on the substrate and electrically conductively connected to the substrate, comprising electrically conductive load current terminal elements, comprising a cooling device, on which the substrate is arranged, and comprising pressure devices respectively having a pressure element, which is arranged movably in the direction of the normal (N) to the substrate, and an elastic deformation element, which is arranged between the pressure element and an assigned load current terminal element, wherein the pressure element presses the assigned load current terminal element against an electrically conductive contact area of the substrate via the elastic deformation element and thereby brings about an electrically conductive pressure contacting of the assigned load current terminal element with the substrate. The invention provides a power semiconductor device whose load current terminal elements are electrically conductively connected to a substrate of the power semiconductor device in a reliable manner.

It is an object of the invention to provide a power semiconductor device whose load current terminal elements are electrically conductively connected to a substrate of the power semiconductor device in a reliable manner. The power semiconductor device is intended to enable, in particular, the simple realization of a power semiconductor device system having at least two power semiconductor devices according to the invention which are arranged one on top of another.

This object is achieved by means of a power semiconductor device comprising a substrate, comprising power semiconductor components arranged on the substrate and electrically conductively connected to the substrate, comprising electrically conductive load current terminal elements, comprising a cooling device, on which the substrate is arranged, and comprising pressure devices respectively having a pressure element, which is arranged movably in the direction of the normal to the substrate, and an elastic deformation element, which is arranged between the pressure element and an assigned load current terminal element, wherein the pressure element presses the assigned load current terminal element against an electrically conductive contact area of the substrate via the elastic deformation element and thereby brings about an electrically conductive pressure contacting of the assigned load current terminal element with the substrate.

It proves to be advantageous if the power semiconductor device has a pressure element receptacle device having first receptacle devices for receiving the pressure elements, wherein at least one section of the respective pressure element is arranged in the respective first receptacle device. The movement latitude of the pressure elements is restricted by the first receptacle devices.

Furthermore, it proves to be advantageous if the first receptacle devices and the pressure elements have a shape such that the first receptacle devices limit movements of the pressure elements running perpendicularly to the direction of the normal to the substrate by positively locking engagement of the pressure elements with the first receptacle devices. What is achieved as a result is that the pressure elements are arranged movably substantially only in the direction of the normal, in particular only in the direction of the normal, to the substrate. In this case, the limitation of the movement by positively locking engagement of the pressure elements with the first receptacle devices preferably already occurs very early, such that the first receptacle devices block movements of the pressure elements running perpendicularly to the direction of the normal to the substrate by positively locking engagement of the pressure elements with the first receptacle devices.

Furthermore, it proves to be advantageous if the first receptacle devices respectively have an opening on their side facing away from the substrate, through which opening respectively a section of the pressure elements is movable in the direction of the normal to the substrate, wherein the first receptacle devices and the pressure elements have a shape such that a movement of the pressure elements in the direction of the normal to the substrate away from the substrate is limited by positively locking engagement of the pressure elements with the first receptacle devices. What is achieved as a result is that the pressure elements are reliably arranged in the receptacle devices. A movement of the pressure elements in the direction of the normal to the substrate away from the substrate is thus possible only as far as a specific limit, since then a further movement of the pressure elements in the direction of the normal to the substrate away from the substrate is by positively locking engagement of the pressure elements with the first receptacle devices. Furthermore, as a result, the elastic deformation elements can be prestressed by means of the receptacle devices, i.e. be compressed at least slightly, and an electrically conductive pressure contacting of the respectively assigned load current terminal element with the substrate can be brought about as a result.

Furthermore, it proves to be advantageous if the pressure elements respectively have a pressure main element and a pin projecting from the pressure main element in a direction away from the substrate, wherein the side surface of the pressure main element facing away from the pin of the pressure element presses onto the elastic deformation element in the direction of the normal to the substrate, since then the pressure elements are embodied in a particularly simple manner.

Furthermore, it proves to be advantageous if the pressure element is connected to the elastic deformation element in a materially-bonded manner, or in a force-locking and/or positively locking manner; then the pressure element together with the elastic deformation element forms a structural unit that enables efficient production of the power semiconductor device.

Furthermore, it proves to be advantageous if the elastic deformation element is embodied as a spring, in particular as a helical spring, or as an elastomer, in particular as a crosslinked silicone rubber, rubber or plastic foam, since then the elastic deformation element can be produced efficiently.

In this context, it proves to be advantageous if the elastic deformation element is embodied as a helical spring, wherein the outermost coil of the helical spring, said outermost coil being arranged at the end of the helical spring facing the assigned load current terminal element, has at least one section which has no pitch, wherein the surface of said section facing the assigned load current terminal element is embodied in a planar fashion. As a result, over a relatively large area of the helical spring, the helical spring homogeneously introduces force on the load current terminal element.

Furthermore, it proves to be advantageous if the pressure devices respectively have an intermediate element arranged between the elastic deformation element and the assigned load current terminal element, wherein the pressure element presses the assigned load current terminal element against an electrically conductive contact area of the substrate via the elastic deformation element and via the intermediate element. By means of the intermediate element, the force transmitted by the elastic deformation element can be distributed over a specific mechanical contact area via which the intermediate element has a mechanical contact with the assigned load current terminal element, wherein the shape and size of the mechanical contact area are determined by the geometric shape of the intermediate element.

In this context, it proves to be advantageous if the intermediate element is connected to the elastic deformation element in a materially-bonded manner, or in a force-locking and/or positively locking manner. The intermediate element together with the elastic deformation element and, if appropriate, additionally with the pressure element can then form a structural unit that enables particularly efficient production of the power semiconductor device.

Furthermore, it proves to be advantageous if the intermediate element has an intermediate main element and a pin projecting from the intermediate main element in the direction of the substrate, wherein the pin of the intermediate element presses onto the assigned load current terminal element in the direction of the normal to the substrate. By means of the pin of the intermediate element, the force transmitted by the elastic deformation element can be distributed over a specific mechanical contact area via which the pin has a mechanical contact with the assigned load current terminal element, wherein the shape and size of the mechanical contact area are determined by the geometric shape of the pin.

Furthermore, it proves to be advantageous if, at least in the case of a portion of the pressure devices, pressure elements arranged directly adjacent are embodied integrally with one another. The individual component parts required for the production of the power semiconductor device are reduced as a result.

Furthermore, it proves to be advantageous if the pressure elements respectively have a pressure main element and a pin projecting from the pressure main element in a direction away from the substrate, wherein the side surface of the pressure main element facing away from the bin presses onto the elastic deformation element in the direction of the normal to the substrate, wherein, at least in the case of a portion of the pressure devices, the pins of pressure elements arranged directly adjacent have different heights. As a result, e.g. if load current terminal elements are arranged one above another, resultant different distances between the pressure elements and the relevant load current terminal elements can be compensated for, such that the same pressure forces are exerted on the relevant load current terminal elements.

Furthermore, it proves to be advantageous if the load current terminal elements have substrate terminal elements running in the direction of the normal to the substrate, via which substrate terminal elements the electrically conductive pressure contactings of the load current terminal elements with the substrate are effected, wherein the pressure devices respectively have a mechanical contact with the regions of the load current terminal elements that are arranged in direct proximity to the substrate terminal elements. As a result, the pressure forces are introduced in a targeted manner on the regions of the load current terminal elements in the direct proximity of which the electrically conductive pressure contactings of the load current terminal elements with the substrate are effected, such that a particularly reliable electrically conductive pressure contacting respectively forms and torques acting on the load current terminal elements on account of the pressure forces are reduced.

Furthermore, a power semiconductor device system comprising a first and a second power semiconductor device according to the invention proves to be advantageous, wherein the second power semiconductor device is arranged on the first power semiconductor device, wherein the outer side of the cooling device of the second power semiconductor device facing the pressure elements of the first power semiconductor device presses against the pressure elements of the first power semiconductor device in the direction of the substrate of the first power semiconductor device. This enables a simple realization of a power semiconductor device system having at least two power semiconductor devices according to the invention which are arranged one on top of another.

The above and other aspects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
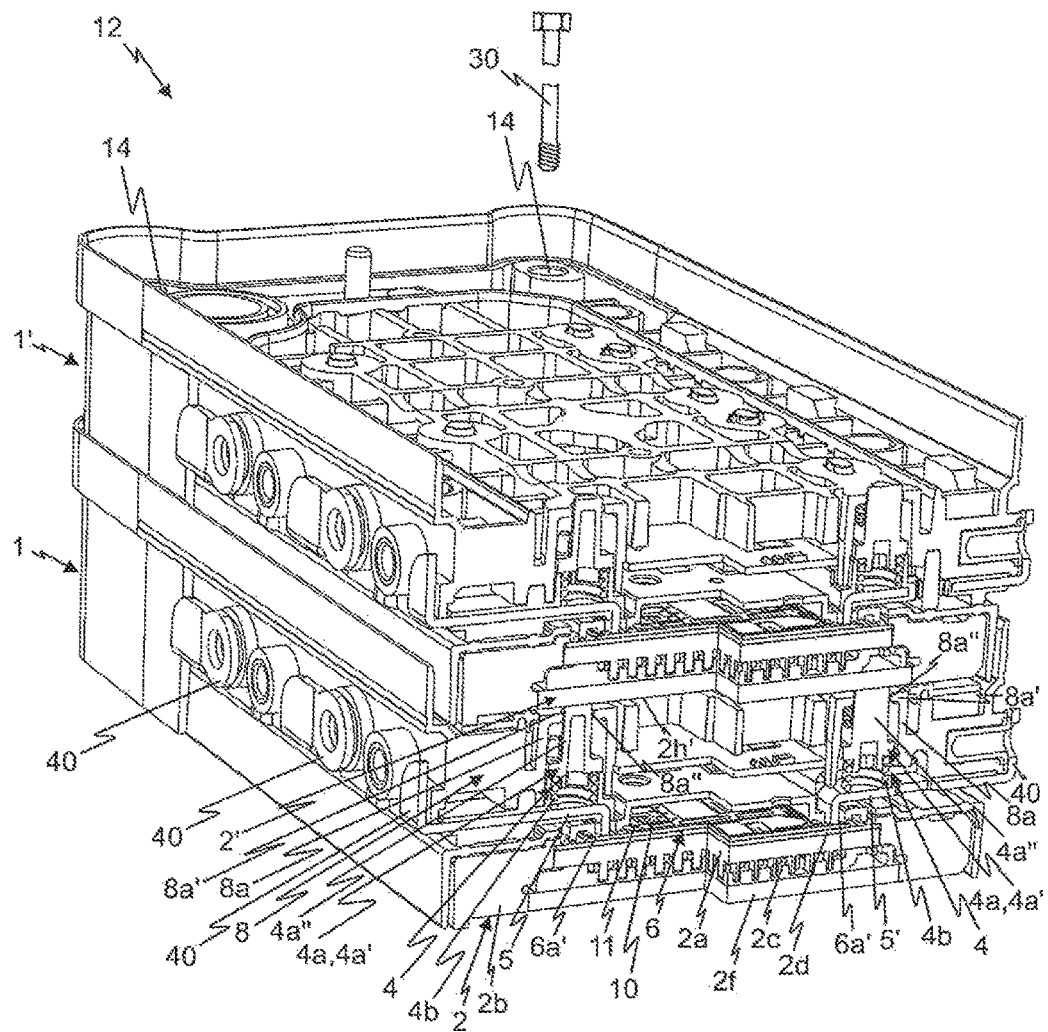
FIG. 1 shows a perspective sectional view of a power semiconductor device system comprising power semiconductor devices according to the invention.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Various operations may be described as multiple discrete operations in turn, in a manner that may be helpful in understanding embodiments of the present invention; however, the order of description should not be construed to imply that these operations are order dependent.

Although only a few embodiments have been disclosed in detail above, other embodiments are possible and the inventors intend these to be encompassed within this specification. The specification describes certain technological solutions to solve the technical problems that are described expressly and inherently in this application. This disclosure describes embodiments, and the claims are intended to cover any modification or alternative or generalization of these embodiments which might be predictable to a person having ordinary skill in the art.

Figure 2:
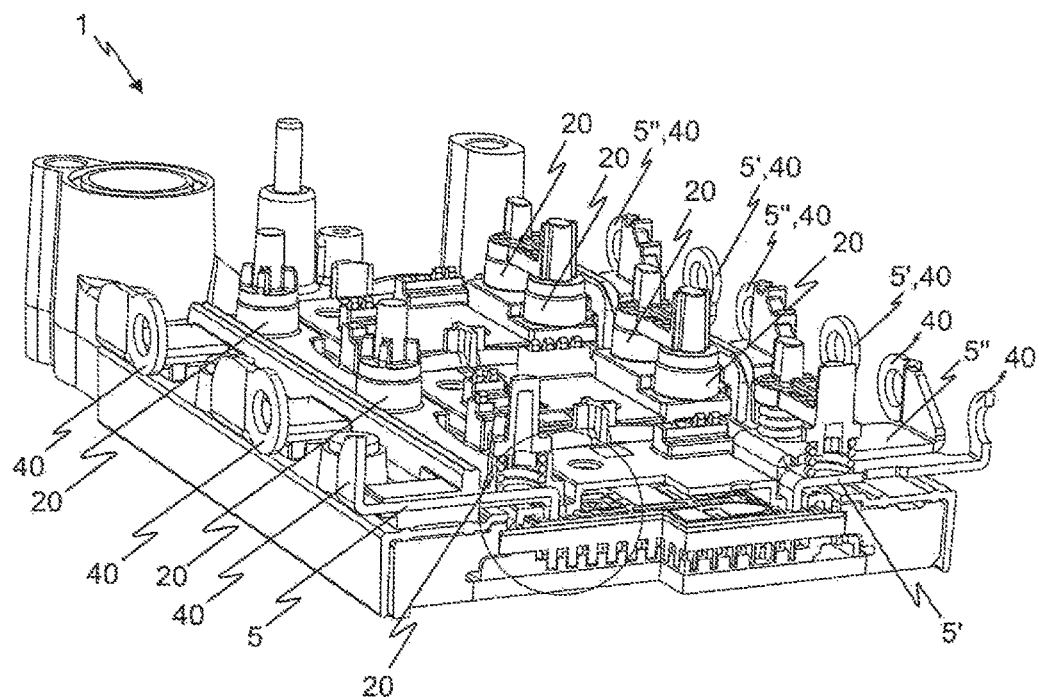
FIG. 2 shows a perspective sectional view of a power semiconductor device according to the invention, wherein the pressure element receptacle device illustrated in FIG. 1 is not illustrated.
Figure 3:
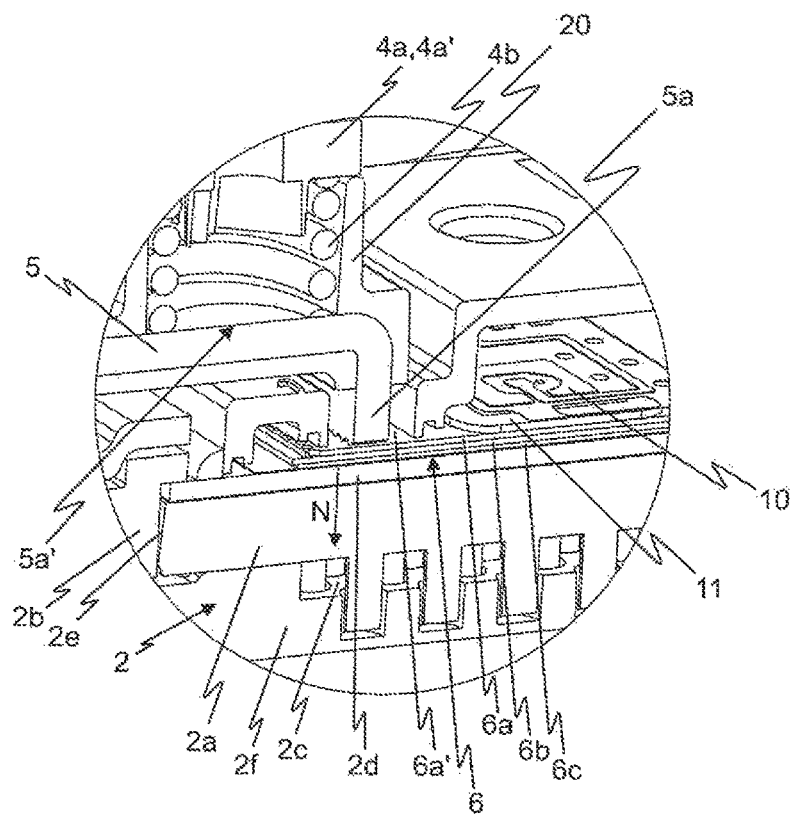
FIG. 3 shows a detail view from FIG. 2.
Figure 4:
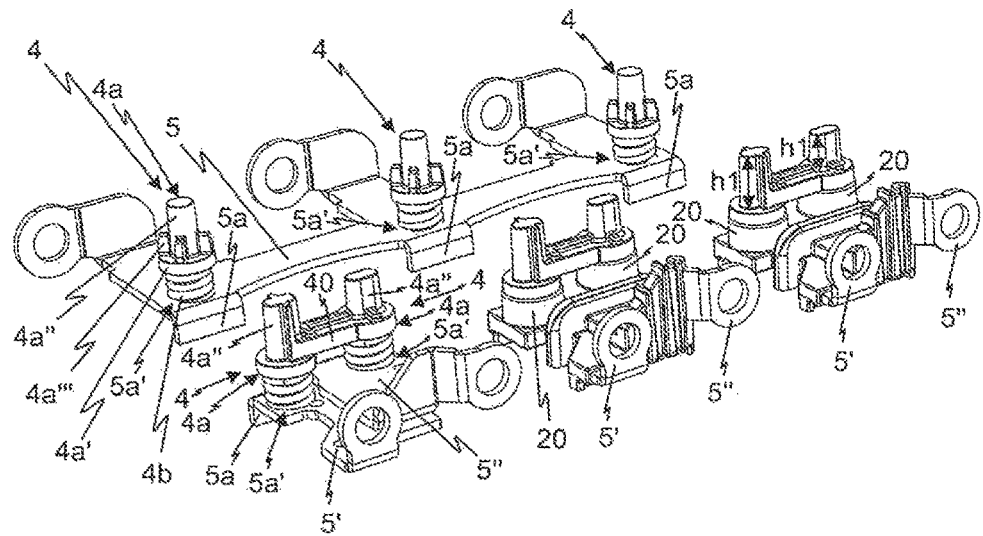
FIG. 4 shows a perspective view of load current terminal elements an. pressure devices of a power semiconductor device according to the invention.

FIG. 1 illustrates a perspective sectional view of a power semiconductor device system 12 having power semiconductor devices 1 and 1' according to the invention that are arranged one on top of another. The power semiconductor devices 1 and 1' are arranged in a manner stacked one on top of another. FIG. 2 illustrates a perspective sectional view of the power semiconductor device 1 according to the invention, wherein the pressure element receptacle device 8 of the power semiconductor device 1 illustrated in FIG. 1 is not illustrated. FIG. 3 illustrates a detail view from FIG. 2. FIG. 4 illustrates a perspective view of load current terminal elements 5, 5', 5" and pressure devices 41 of the power semiconductor device 1 according to the invention. The power semiconductor devices 1 and 1' of the power semiconductor device system 12 are preferably embodied identically. It should be noted that the power semiconductor device system 12 can have a minimum of two power semiconductor devices according to the invention and, of course, can have more power semiconductor devices according to the invention arranged one on top of another than the illustrated power semiconductor devices 1 and 1' according to the invention.

Hereinafter, in the description reference is substantially made only to the power semiconductor device 1, for the sake of simplicity. The description also applies to the power semiconductor device 1' in an identical way.

It should be noted that, in the context of the exemplary embodiment, by means of the power semiconductor device 1, a DC voltage is inverted into a one-phase or three-phase AC voltage, or a one-phase or three-phase AC voltage is rectified into a DC voltage.

The power semiconductor device 1 according to the invention has a substrate 6, on which power semiconductor components 11 electrically conductively connected to the substrate 6 are arranged. The respective power semiconductor component 11 is preferably in the form of a power semiconductor switch or a diode. In this case, the power semiconductor switches are generally present in the form of transistors, such as e.g. IGBTs (Insulated Gate Bipolar Transistor) or MOSFETs (Metal Oxide Semiconductor Field Effect Transistor), or in the form of thyristors. The substrate 6 has an insulant body 6b (e.g. ceramic body), and an electrically conductive structured first conduction layer 6a, which is arranged on a first side of the insulant body 6b and is connected to the insulant body 6b and which forms electrically conductive contact areas 6a' on account of its structure. Preferably, the substrate 6 has an electrically conductive, preferably unstructured, second conduction layer 6c, wherein the insulant body 6b is arranged between the structured first conduction layer 6a and the second conduction layer 6c. The substrate 6 can be present, as in the exemplary embodiment, e.g. in the form of a direct copper bonded substrate (DCB substrate) or in the form of an insulated metal substrate (IMS). The power semiconductor components 11 are preferably connected to assigned electrically conductive contact areas 6a' of the substrate 6 in a materially-bonded manner (e.g. by means of a solder layer or sintering layer).

The power semiconductor device 1 furthermore has electrically conductive load current terminal elements 5, 5' and 5", which carry load currents during the operation of the power semiconductor device 1. The respective load current terminal element 5, 5' and 5" can be embodied integrally (as in the exemplary embodiment) or in a multipartite fashion. The substrate 6 is electrically conductively connected to electrical terminals 40 of the power semiconductor device 1 by means of the load current terminal elements 5, 5' and 5". In this case, the load currents which flow through the load current terminal elements generally have a high current intensity, in contrast to control currents which serve for driving the power semiconductor components, for example, if the power semiconductor components are embodied as power semiconductor switches. In the context of the exemplary embodiment, the first load current terminal elements 5 are embodied as load current terminal elements having AC voltage potential during the operation of the power semiconductor device 1, and the second load current terminal elements 5' and 5" are embodied as load current terminal elements having DC voltage potential during the operation of the power semiconductor device 1. In this regard, the load current terminal elements 5' have a positive voltage potential and the load current terminal elements 5" have a negative voltage potential, or vice versa. The load current terminal elements 5' and 5" are arranged in a manner electrically insulated from one another by an electrical insulation material (e.g. crosslinked silicone rubber).

The power semiconductor device 1 furthermore has a cooling device 2, on which the substrate 6 is arranged. In this case, the substrate 6 can be materially bonded to the cooling device 2 via a sintering layer or solder layer arranged between the cooling device 2 and the substrate 6. Alternatively, a thermally conductive paste can be arranged between the substrate 6 and the cooling device 2. In the context of the exemplary embodiment, the cooling device 2 has a liquid main heat sink 2b, which has an opening 2e, and a partial heat sink 2a, which is arranged in the region of the opening 2e and on which a metal plate 2d of the cooling device 2 is arranged. A liquid channel 2c is arranged between a heat sink baseplate 2f of the cooling device 2 and the partial heat sink 2a. The liquid main heat sink 2a together with the partial heat sink 2b, the metal plate 2d and the heat sink baseplate 2f forms a liquid heat sink (e.g. water heat sink). Alternatively, the cooling device 2 could also be embodied as an air heat sink. The cooling device 2 can be embodied integrally or in a multipartite fashion (as in the exemplary embodiment, for example).

The power semiconductor device 1 furthermore has pressure devices 4 respectively having a pressure element 4a, which is arranged movably in the direction of the normal N to the substrate 6, and an elastic deformation element 4b, which is arranged between the pressure element 4a and a load current terminal element 5, 5' or 5" assigned to the pressure device 4, wherein the pressure element 4a presses the assigned load current terminal element 5, 5' or 5" against an electrically conductive contact area. 6a' of the substrate 6 via the elastic deformation element 4b and brings about an electrically conductive pressure contacting of the assigned load current terminal element 5, 5' or 5" with the substrate 6 as a result. As evident in FIG. 4, for example, a load current terminal element, here specifically load current terminal element 5, can also be assigned to a plurality of pressure devices 4. The pressure elements 4a preferably consist of plastic.

A reliable electrically conductive pressure contacting of the load current terminal elements with the substrate 6 of the power semiconductor device 1 is achieved as a result.

In the simplest case, the pressure device 4 can press the respective load current terminal element 5 against a respective electrically conductive contact area 6a of the substrate 6 by virtue of the requisite pressure force being generated by the gravitational force that presses the pressure device 4 against the respective load current terminal element 5 and thus against the respective electrically conductive contact area 6a of the substrate 6 if the pressure device 4 is arranged above the load current terminal element 5, relative to the centre of the Earth.

The load current terminal element 5, 5' or 5" preferably has at least one substrate terminal element 5a which runs in the direction of the normal N to the substrate 6 and via which the electrically conductive pressure contacting of the assigned load current terminal element 5, 5' or 5" with the substrate 6 is effected, wherein the respective pressure device 4 respectively has a mechanical contact with the region 5a' of the assigned load current terminal element 5, 5' or 5" that is arranged in direct proximity to the respective substrate terminal element 5a (see FIG. 3 and FIG. 4). As a result, the pressure forces are introduced in a targeted manner on those regions of the load current terminal elements 5, 5' and 5", respectively, in the direct proximity of which the electrically conductive pressure contactings of the load current terminal element 5, 5' and 5" with the substrate 6 are effected, such that respectively a particularly reliable electrically conductive pressure contacting forms and torques acting on the load current terminal elements 5, 5' and 5" owing to the pressure forces are reduced.

The power semiconductor device 1 preferably has a pressure element receptacle device 8 having first receptacle devices 8a for receiving the pressure elements 4a, wherein at least one section of the respective pressure element 4a is arranged in the respective first receptacle device 8a. Preferably, the first receptacle devices 8a and the pressure elements 4a have a shape such that the first receptacle devices 8a limit movements of the pressure elements 4a running perpendicularly to the direction of the normal N to the substrate 6 by positively locking engagement of the pressure elements 4a with the first receptacle devices 8a. Preferably, the first receptacle devices 8a respectively have an opening 8a" on their side 8a' facing away from the substrate 6, through which opening respectively a section 4a" of the pressure elements 4a is movable in the direction of the normal N to the substrate 6. The first receptacle device 8a, and in particular the opening 8a" preferably forms a guide for a movement of the respective pressure element 4a in the direction of the normal N to the substrate 6. The pressure element receptacle device 8 is connected to the cooling device 2, preferably by means of screw connections, directly or indirectly, i.e. e.g. via at least one mechanically interposed element. The pressure element receptacle device 8 is preferably an integral part of a housing part of the power semiconductor device 1.

Figure 5:
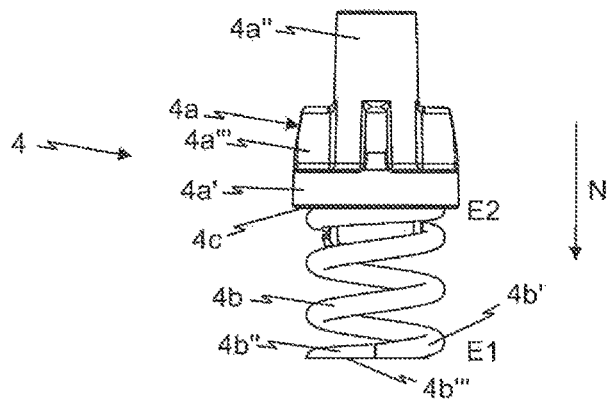
FIG. 5 shows a front view of a pressure device.
Figure 6:
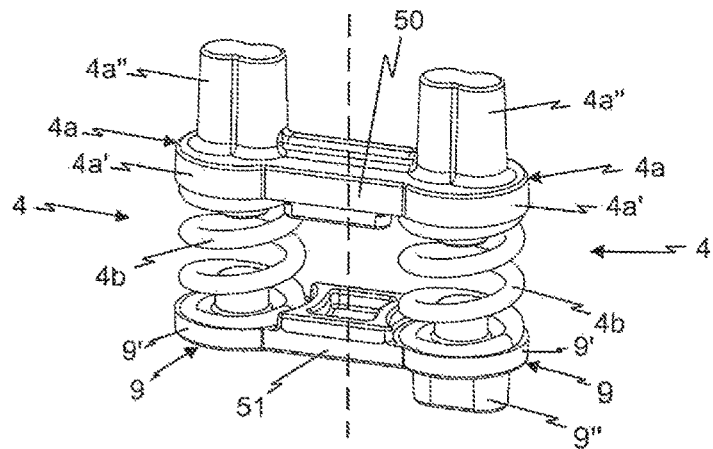
FIG. 6 shows a perspective view of a further embodiment of pressure devices.
Figure 7:
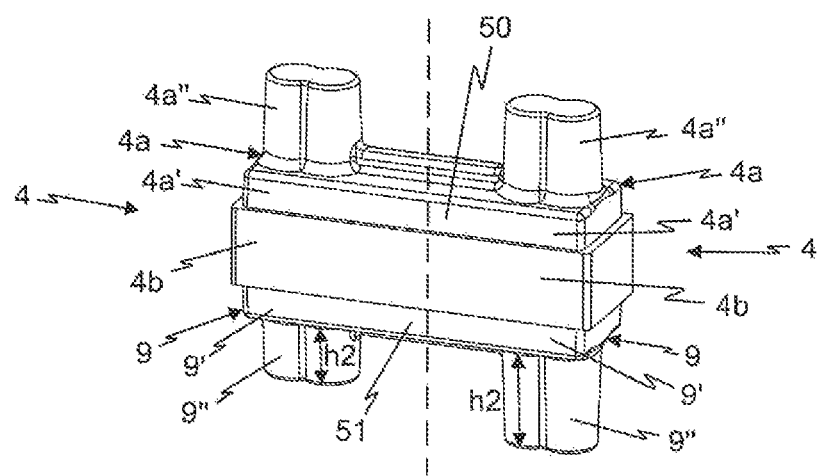
FIG. 7 shows a perspective view of a further embodiment of pressure devices.

FIGS. 5 to 7 illustrate various embodiments of pressure devices 4. FIGS. 6 and 7 illustrate in each case two pressure devices 4, which are connected to one another or, as indicated by a dashed line, can be separated from one another.

Preferably, the pressure elements 4a respectively have a pressure main element 4a' and a pin 4a" projecting from the pressure main element 4a in a direction away from the substrate 6, wherein the side surface 4c of the pressure main element 4a facing away from the pin 4a" presses onto the elastic deformation element 4b in the direction of the normal N to the substrate 6.

Preferably, the pressure element 4a is connected to the elastic deformation element 4b in a materially-bonded manner, or in a force-locking and/or positively locking manner, such that the pressure element 4a together with the elastic deformation element 4b forms a structural unit that enables efficient production of the power semiconductor device 1.

The elastic deformation element 4b is preferably embodied as a spring, in particular—as illustrated for example in FIGS. 1 to 6—as a helical spring 4b . The spring is preferably formed from steel. The outermost coil 4b' of the helical spring 4b, said outermost coil being arranged at the end E1 (see FIG. 5) of the helical spring 4b facing the assigned load current terminal element 5, 5' or 5", preferably has at least one section 4b" which has no pitch, wherein the surface 4b''' of said section 4b" facing the assigned load current terminal element 5, 5' or 5" is embodied in a planar fashion. As a result, over a relatively large area of the helical spring 4b, the helical spring 4b homogenously introduces force on the load current terminal element 5, 5' or 5". The outermost coil of the helical spring 4b that is arranged at the end E2 of the helical spring 4b facing away from the assigned load current terminal element 5, 5' or 5" can likewise have at least one section having no pitch, wherein the surface of said section facing away from the assigned load current terminal element 5, 5' or 5" is likewise embodied in a planar fashion.

As illustrated by way of example in FIG. 7, the elastic deformation element 4b can also be embodied as an elastomer, to particular as crosslinked silicone rubber, rubber or plastic foam.

An embodiment of the elastic deformation element 4b as a spring composed of steel, in particular as a helical spring composed of steel, has the advantage over an embodiment of the elastic deformation element 4b as an elastomer that a steel spring can transmit greater pressure forces than an elastomer with long-term stability and thermal stability.

The elastic deformation element 4b preferably has a mechanical contact with the assigned load current terminal element 5, 5' or 5".

As illustrated by way of example in FIG. 6 and FIG. 7, the pressure devices 4 can also respectively have an intermediate element 9 arranged between the elastic deformation element 4b and the assigned load current terminal element 5, 5' and 5", wherein the pressure element 4a presses the assigned load current terminal element 5, 5' and 5" against an electrically conductive contact area 6a of the substrate 6 via the elastic deformation element 4b and via the intermediate element 9. By means of the intermediate element 9, the force transmitted by the elastic deformation element 4b can be distributed over a specific mechanical contact area via which the intermediate element 9 has a mechanical contact with the assigned load current terminal element 5, 5' or 5", wherein the shape and size of the mechanical contact area are determined by the geometric shape of the intermediate element 9. As illustrated by way of example in FIG. 6 and FIG. 7, the intermediate element 9 cart have an intermediate main element 9' and additionally a pin 9" projecting from the intermediate main element 9' in the direction of the substrate 6, wherein the pin 9" of the intermediate element 9 presses onto the assigned load current terminal element 5, 5' and 5" in the direction of the normal N to the substrate 6. The intermediate element 9 preferably consists of plastic.

The intermediate element 9 is preferably connected to the elastic deformation element 4b in a materially-bonded manner, or in a force locking and/or positively locking manner, such that the intermediate element 9 together with the elastic deformation element 4b and, if appropriate, additionally with the pressure element 4a can form a structural unit that enables efficient production of the power semiconductor device 1.

The pressure elements 4a and the intermediate elements 9 are preferably formed from plastic.

As illustrated by way of example in FIG. 2, FIG. 4, FIG. 6 and FIG. 7, at least in the case of a portion of the pressure devices, pressure elements 4a arranged directly adjacent can be embodied integrally with one another. For this purpose, pressure elements 4a arranged directly adjacent are preferably connected to one another via a first web 50. In the context of the exemplary embodiment, the load current terminal elements 5' and 5" are arranged directly adjacent.

Furthermore, as illustrated by way of example in FIG. 6 and FIG. 7, at least in the case of a portion of the pressure devices, intermediate elements 9 arranged directly adjacent can be embodied integrally with one another. For this purpose, intermediate elements 9 arranged directly adjacent are preferably connected to one another via a second web 51.

The pins 4a" of pressure elements 4a arranged directly adjacent can have different heights h1, as illustrated by way of example in FIG. 4. Alternatively or additionally, the pins 9" of intermediate elements 9 arranged directly adjacent can have different heights h2, as illustrated by way of example in FIG. 7. As a result, e.g. if the load current terminal elements 5' and 5" are arranged one above another as in the exemplary embodiment, resultant different distances between the pressure elements 4a and the load current terminal elements 5' and 5" can be compensated for, such that the same pressure forces are exerted on the load current terminal elements 5' and 5".

The power semiconductor device 1 preferably has second receptacle devices 20 arranged on the load current terminal elements 5, 5' and 5" and serving for receiving the springs 4b or the pins 9" of the intermediate elements 9, wherein at least one section of the respective spring 4b or of the respective pin 9" of the respective intermediate element 9 is arranged in the respective second receptacle device 20. The second receptacle devices 20 are preferably formed from an elastomer, in particular from a crosslinked silicone rubber. The electrical creepage path between the respective spring 4b and electrically conductive elements arranged in direct proximity to the respective spring 4b is increased with the use of springs 4b composed of steel. It should be noted that the second receptacle devices 20 are not illustrated in FIG. 2 and FIG. 4 in the case of the two frontmost load current terminal elements 5' and 5" illustrated.

Hereinafter, the power semiconductor device 1 is designated as first power semiconductor device 1 and the power semiconductor device 1' is designated as second power semiconductor device 1'.

In the context of the exemplary embodiment, as illustrated by way of example in FIG. 1, the power semiconductor device system 12 has a first power semiconductor device 1 according to the invention and a second power semiconductor device 1' according to the invention. The second power semiconductor device 1' is arranged on the first power semiconductor device 1. The outer side 2h' of the cooling device 2' of the second power semiconductor device 1' facing the pressure elements 4a of the first power semiconductor device 1 presses against the pressure elements 4a of the first power semiconductor device 1 in the direction of the substrate 6 of the first power semiconductor device 1. Consequently, via the respective elastic deformation element 4b of the first power semiconductor device 1, the respective pressure element 4a of the first power semiconductor device 1 presses the assigned load current terminal element 5, 5' or 5" of the first power semiconductor device 1 against the electrically conductive contact area 6a' of the substrate 6 of the first power semiconductor device 1 and thereby brings about an electrically conductive pressure contacting of the assigned load current terminal element 5, 5' or 5" of the first power semiconductor device 1 with the substrate 6 of the first power semiconductor device 1.

The respective power semiconductor device 1, 1', in particular the cooling device 2 and 2' of the respective power semiconductor device 1 and 1', has through holes 14, through which pressure generating means 30, such as e.g. screws or threaded rods, are led and by means of which the power semiconductor devices 1 and 1' are screwed together and the power semiconductor devices 1 and 1' are pressed against one another and the relevant outer side of the cooling device of the respective power semiconductor device thus presses against the pressure elements of the respective power semiconductor device arranged adjacent. By means of the pressure devices 4, pressure generated by the pressure generating means 30 for the pressure contacting of the load current terminal elements 5, 5' and 5" with the substrate 6 is distributed on the load current terminal elements 5, 5' and 5".

It should be noted that in FIG. 1 the pressure elements 4a and the springs 4b of the second power semiconductor device 1' are illustrated in a position that they would have if a third power semiconductor device according to the invention were arranged on the second power semiconductor device 1', the cooling device of said third power semiconductor device pressing the pressure elements 4a of the second power semiconductor device 1' in the direction of the substrate 6 of the second power semiconductor device 1'. If, as illustrated in FIG. 1, a third power semiconductor device according to the invention is not present, then the springs 4b of the second power semiconductor device 1' would press the pressure elements 4a of the second power semiconductor device 1' in a direction away from the substrate 6 of the second power semiconductor device 1' and thus away from the substrate 6 of the second power semiconductor device 1' until the pressure elements 4a of the second power semiconductor device 1', in particular the stop elements 4a''' thereof (see FIG. 5), strike the first receptacle devices 8a of the second power semiconductor device 1' in the region of the openings 8a' and the pins 4a'' of the pressure elements 4a would then project from the openings 8a' more than as illustrated in FIG. 1.

The pressure elements 4a, the elastic deformation elements 4b and the first receptacle devices 8a are preferably embodied in a proportioned manner with respect to one another in such a way that if no pressure is exerted on the pressure elements 4a by an external element in the direction of the substrate 6, the receptacle devices 8a already prestress the elastic deformation elements 4b, i.e. compress them at least slightly, such that the assigned load current terminal elements 5, 5' and 5" are pressed against the electrically conductive contact areas 6a of the substrate 6 by the elastic deformation elements 4b and an electrically conductive pressure contacting of the respectively assigned load current terminal element 5, 5' and 5" with the substrate 6 is brought about as a result.

It should be noted at this juncture that, of course, features of different exemplary embodiments of the invention, provided that the features are not mutually exclusive, can be combined with one another in any desired manner.

Also, the inventors intend that only those claims which use the words "means for" are intended to be interpreted under 35 USC 112, sixth paragraph. Moreover, no limitations from the specification are intended to be read into any claims, unless those limitations are expressly included in the claims.

Where a specific numerical value is mentioned herein, it should be considered that the value may be increased or decreased by 20%, while still staying within the teachings of the present application, unless some different range is specifically mentioned. Where a specified logical sense is used, the opposite logical sense is also intended to be encompassed.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A power semiconductor device, comprising:
    a substrate having at least one cooling device;
    at least one power semiconductor component arranged on the substrate and electrically and conductively connected to the substrate;
    a plurality of electrically conductive load current terminal element, on said substrate, said load current terminal elements further comprising:
        at least one pressure device, each said pressure device further comprising:
            at least one pressure element, arranged movably in a direction that is normal (N) to the substrate;
            at least one elastic deformation element, arranged between the pressure element and said at least one assigned load current terminal element; and
            the at least one pressure element pressing the at least one load current terminal element against an electrically conductive contact area of the substrate through the elastic deformation element and thereby providing an electrically conductive pressure contact between the at least one load current terminal element and said substrate; and
    a pressure element receptacle device, comprising:
        a first receptacle device for receiving said at least one pressure element, wherein at least one section of a respective said pressure element is arranged in the respective first receptacle device;
        wherein the first receptacle device and the pressure elements have a shape such that the first receptacle device limits a movement of the pressure elements that are running perpendicularly to the direction of the normal (N) to the substrate by a positively locking engagement of the pressure elements with the first receptacle device.

2. The power semiconductor device, according to claim 1, wherein:
    the first receptacle device has an opening on a side facing away from the substrate, through which opening respectively a section of the at least one pressure element is movable in the direction of the normal (N) to the substrate; and
    the first receptacle device and the pressure elements have a shape such that a movement of the pressure element in the direction of the normal (N) to the substrate away from the substrate is limited by a positively locking engagement of the pressure elements with the first receptacle device.

3. The power semiconductor device, according to claim 1, wherein:
    the at least one pressure element further comprise:
        a pressure main element and a pin projecting from the pressure main element in a direction away from the substrate; and
        a side surface of the pressure main element facing away from the pin of the pressure element presses onto the elastic deformation element in the direction of the normal (N) to the substrate.

4. The power semiconductor device, according to claim 1, wherein:
    the pressure element is connected to the elastic deformation element in at least one of a materially-bonded manner, a force-locking, and a positively locking manner.

5. The power semiconductor device, according to claim 1, wherein:
    the elastic deformation element is a spring; and
        said spring selected from a group of springs consisting of: a helical spring, an elastomer spring, a cross-linked silicone rubber spring, a rubber spring, and a plastic foam spring.

6. The power semiconductor device, according to claim 5, wherein:

the elastic deformation element is said helical spring;
said helical spring having an outermost coil arranged at an end (E1) of the helical spring that faces the assigned load current terminal element; and
said end (E1) of said outermost coil having at least one no-pitch section which has no pitch, wherein a surface of said no-pitch section facing the assigned load current terminal element is planar.

7. The power semiconductor device, according to claim 1, wherein:
the at least one pressure device, further comprising:
an intermediate element between the elastic deformation element and the assigned load current terminal element; and
the pressure element urging the assigned load current terminal element against said electrically conductive contact area of the substrate through the elastic deformation element and the intermediate element.

8. The power semiconductor device, according to claim 7, wherein:
the intermediate element is connected to the elastic deformation element in at least one of a materially-bonded manner, a force-locking manner, and a positively locking manner.

9. The power semiconductor device, according to claim 8, wherein:
the intermediate element further comprises:
an intermediate main element and a pin projecting from the intermediate main element in the direction of the substrate; and
the pin of the intermediate element presses onto the assigned load current terminal element in the direction of the normal (N) to the substrate.

10. The power semiconductor device, according to claim 1, wherein:
said at least one pressure device and said at least one pressure element are adjacent and are integral with one another.

11. The power semiconductor device, according to claim 1, wherein:
the at least one pressure element respectively has a pressure main element and at least a first and a second pin projecting from the pressure main element in a direction normal (N) away from the substrate;
a side surface of the pressure main element facing away from the pin presses onto the elastic deformation element in the direction of the normal (N) to the substrate; and
in a portion of said at last one pressure device of said pressure element, at said at least first pin has a first pin-height and said second pin has a second pin-height that is different from said first pin-height.

12. The power semiconductor device, according to claim 1, wherein:
the at least one load current terminal element has a substrate terminal element running in the direction of the normal (N) to the substrate; and
wherein the at least one pressure device has a mechanical contact with a region of the load current terminal elements arranged in direct proximity to the substrate terminal elements.

13. A power semiconductor device system, comprising:
at least a first and a second power semiconductor device;
each said power semiconductor device, further comprising:
a substrate having at least one cooling device;
at least one power semiconductor component arranged on the substrate and electrically and conductively connected to the substrate;
a plurality of electrically conductive load current terminal element, on said substrate, said load current terminal elements further comprising:
at least one pressure device, each said pressure device further comprising:
at least one pressure element, arranged movably in a direction that is normal (N) to the substrate;
at least one elastic deformation element, arranged between the pressure element and said at least one assigned load current terminal element;
the at least one pressure element pressing the at least one load current terminal element against an electrically conductive contact area of the substrate through the elastic deformation element and thereby providing an electrically conductive pressure contact between the at least one load current terminal element and said substrate; and
wherein the second power semiconductor device is arranged on the first power semiconductor device; and
an outer side of the cooling device of the second power semiconductor device faces the at least one pressure element of the first power semiconductor device and presses against the pressure element of the first power semiconductor device in the direction of the substrate of the first power semiconductor device.

14. The power semiconductor system, according to claim 13, further comprising:
in at least one of said first and said second power semiconductor devices, a pressure element receptacle device, further comprising:
a first receptacle device for receiving said at least one pressure element, wherein at least one section of a respective said pressure element is arranged in the respective first receptacle device.

15. The power semiconductor system, device according to claim 14, wherein:
the first receptacle device and the pressure elements have a shape such that the first receptacle device limits a movement of the pressure elements that are running perpendicularly to the direction of the normal (N) to the substrate by a positively locking engagement of the pressure elements with the first receptacle device.

16. The power semiconductor system, according to claim 14, wherein:
the first receptacle device has an opening on a side facing away from the substrate, through which opening respectively a section of the at least one pressure element is movable in the direction of the normal (N) to the substrate; and
the first receptacle device and the pressure elements have a shape such that a movement of the pressure element in the direction of the normal (N) to the substrate away from the substrate is limited by a positively locking engagement of the pressure elements with the first receptacle device.

17. The power semiconductor system, according to claim 14, wherein:
the at least one pressure element further comprises:
a pressure main element and a pin projecting from the pressure main element in a direction away from the substrate; and a side surface of the pressure main element facing away from the pin of the pressure element presses onto the elastic deformation element in the direction of the normal (N) to the substrate.

18. The power semiconductor system, according to claim 14, wherein:
the pressure element is connected to the elastic deformation element in at least one of a materially-bonded manner, a force-locking, and a positively locking manner.

19. A power semiconductor device, comprising:
a substrate having at least one cooling device;
at least one power semiconductor component arranged on the substrate and electrically and conductively connected to the substrate;
a plurality of electrically conductive load current terminal element, on said substrate, said load current terminal elements further comprising:
  at least one pressure device, each said pressure device further comprising:
    at least one pressure element, arranged movably in a direction that is normal (N) to the substrate;
    at least one elastic deformation element, arranged between the pressure element and said at least one assigned load current terminal element; and
    the at least one pressure element pressing the at least one load current terminal element against an electrically conductive contact area of the substrate through the elastic deformation element and thereby providing an electrically conductive pressure contact between the at least one load current terminal element and said substrate; and
  a pressure element receptacle device, comprising:
    a first receptacle device for receiving said at least one pressure element, wherein at least one section of a respective said pressure element is arranged in the respective first receptacle device;
wherein:
  the at least one pressure device, further comprises:
    an intermediate element between the elastic deformation element and the assigned load current terminal element; and
    the pressure element urging the assigned load current terminal element against said electrically conductive contact area of the substrate through the elastic deformation element and the intermediate element.

20. A power semiconductor device, comprising:
a substrate having at least one cooling device;
at least one power semiconductor component arranged on the substrate and electrically and conductively connected to the substrate;
a plurality of electrically conductive load current terminal element, on said substrate, said load current terminal elements further comprising:
  at least one pressure device, each said pressure device further comprising:
    at least one pressure element, arranged movably in a direction that is normal (N) to the substrate;
    at least one elastic deformation element, arranged between the pressure element and said at least one assigned load current terminal element; and
    the at least one pressure element pressing the at least one load current terminal element against an electrically conductive contact area of the substrate through the elastic deformation element and thereby providing an electrically conductive pressure contact between the at least one load current terminal element and said substrate; and
  a pressure element receptacle device, comprising:
    a first receptacle device for receiving said at least one pressure element, wherein at least one section of a respective said pressure element is arranged in the respective first receptacle device;
wherein:
  the at least one pressure element respectively has a pressure main element and at least a first and a second pin projecting from the pressure main element in a direction normal (N) away from the substrate;
  a side surface of the pressure main element facing away from the pin presses onto the elastic deformation element in the direction of the normal (N) to the substrate; and
  in a portion of said at last one pressure device of said pressure element, at said at least first pin has a first pin-height and said second pin has a second pin-height that is different from said first pin-height.

* * * * *